United States Patent
Sogabe et al.

(10) Patent No.: US 9,834,838 B2
(45) Date of Patent: Dec. 5, 2017

(54) ZN—SN—O BASED OXIDE SINTERED BODY AND METHOD FOR PRODUCING THE SAME

(75) Inventors: Kentaro Sogabe, Tokyo (JP); Makoto Ozawa, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 292 days.

(21) Appl. No.: 14/123,563

(22) PCT Filed: Jun. 21, 2012

(86) PCT No.: PCT/JP2012/065899
§ 371 (c)(1),
(2), (4) Date: Dec. 3, 2013

(87) PCT Pub. No.: WO2013/021737
PCT Pub. Date: Feb. 14, 2013

(65) Prior Publication Data
US 2014/0102893 A1    Apr. 17, 2014

(30) Foreign Application Priority Data
Aug. 5, 2011 (JP) ................. 2011-171707

(51) Int. Cl.
C23C 14/08 (2006.01)
C23C 14/34 (2006.01)
C04B 35/453 (2006.01)

(52) U.S. Cl.
CPC .......... *C23C 14/086* (2013.01); *C04B 35/453* (2013.01); *C23C 14/3414* (2013.01); *C04B 2235/3217* (2013.01); *C04B 2235/3232* (2013.01); *C04B 2235/3251* (2013.01); *C04B 2235/3256* (2013.01); *C04B 2235/3258* (2013.01); *C04B 2235/3284* (2013.01); *C04B 2235/3286* (2013.01); *C04B 2235/3293* (2013.01); *C04B 2235/3294* (2013.01); *C04B 2235/5445* (2013.01); *C04B 2235/604* (2013.01); *C04B 2235/6585* (2013.01); *C04B 2235/763* (2013.01); *C04B 2235/786* (2013.01); *C04B 2235/787* (2013.01); *C04B 2235/96* (2013.01)

(58) Field of Classification Search
None
See application file for complete search history.

(56) References Cited

U.S. PATENT DOCUMENTS

| | | | |
|---|---|---|---|
| 6,534,183 B1* | 3/2003 | Inoue | C03C 17/2453 257/E31.126 |
| 2007/0215456 A1 | 9/2007 | Abe | |
| 2009/0065746 A1* | 3/2009 | Hattori et al. | C01G 9/02 252/519.5 |
| 2010/0108951 A1 | 5/2010 | Hasegawa | |
| 2011/0114475 A1* | 5/2011 | Hasegawa | C23C 14/0036 204/192.29 |

FOREIGN PATENT DOCUMENTS

| | | |
|---|---|---|
| JP | 2604474 B2 | 1/1997 |
| JP | 2006-196200 A1 | 7/2006 |
| JP | 2007-277075 A1 | 10/2007 |
| JP | 2007-314364 A1 | 12/2007 |
| JP | 2008-192604 A1 | 8/2008 |
| JP | 2010-37161 A1 | 2/2010 |
| JP | 2010-70409 A1 | 4/2010 |
| JP | 4552950 B2 | 7/2010 |

OTHER PUBLICATIONS

International Search Report for International Application No. PCT/JP2012/065899 dated Sep. 11, 2012.

* cited by examiner

*Primary Examiner* — Katie L Hammer
(74) *Attorney, Agent, or Firm* — Kratz, Quintos & Hanson, LLP

(57) ABSTRACT

[Object] Provided are a Zn—Sn—O-based oxide sintered body which is used as a sputtering target or a tablet for vapor deposition and which is resistant to crack formation and the like during film formation, and a method for producing the same. [Solving means] The oxide sintered body is characterized in that tin is contained with an atomic ratio of Sn/(Zn+Sn) being 0.01 to 0.6, an average crystal particle diameter of the sintered body is 4.5 μm or less, and a degree of orientation represented by $I_{(222)}/[I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation. The oxide sintered body has an improved mechanical strength, so that the oxide sintered body is resistant to breakage during processing of the sintered body and also is resistant to breakage and crack formation during film formation of transparent conductive films when used as a sputtering target or a tablet for vapor deposition.

7 Claims, No Drawings

ZN—SN—O BASED OXIDE SINTERED BODY AND METHOD FOR PRODUCING THE SAME

TECHNICAL FIELD

The present invention relates to a Zn—Sn—O-based oxide sintered body used as any one of a sputtering target or a tablet for vapor deposition, which are raw materials of transparent conductive films used for solar cells, liquid crystal surface elements, touch panels, and the like, for producing these transparent conductive films by a sputtering method such as direct-current sputtering or high-frequency sputtering or a vapor deposition method such as ion plating. In particular, the present invention relates to a Zn—Sn—O-based oxide sintered body which is resistant to breakage and crack formation in a step of producing transparent conductive films and which is stable in terms of both film formability and film characteristics of the transparent conductive films, when the oxide sintered body is used as a sputtering target or a tablet for vapor deposition. The present invention relates to a method for producing the Zn—Sn—O-based oxide sintered body.

BACKGROUND ART

Because of the high electrical conductivity and high transmittance in the visible light region, transparent conductive films are used for solar cells, liquid crystal display elements, surface elements for organic electroluminescence, inorganic electroluminescence, etc., electrodes for touch panels, and the like, and also are used as heat ray reflection films for automobile windows or architecture, antistatic films, and various anti-fogging transparent heaters for freezer showcase and the like.

Here, examples of films known as the transparent conductive films include tin oxide ($SnO_2$)-based thin films, zinc oxide (ZnO)-based thin films, indium oxide ($In_2O_3$)-based thin films, and the like.

As the tin oxide-based thin films, those containing antimony as a dopant (ATO) and those containing fluorine as a dopant (FTO) are commonly used. Meanwhile, as the zinc oxide-based thin films, those containing aluminum as a dopant (AZO) and those containing gallium as a dopant (GZO) are commonly used. The transparent conductive films most commonly used in the industrial field are based on indium oxide. Of these indium oxide-based transparent conductive films, indium oxide films containing tin as a dopant, i.e., In—Sn—O-based films, which are referred to as ITO (Indium tin oxide) films, are widely used especially because these films can be obtained easily as transparent conductive films having low resistance.

As a method for producing those transparent conductive films, a sputtering method such as direct-current sputtering or high-frequency sputtering is often used. The sputtering method is effective when a film is formed from a material having a low vapor pressure or when precise control of the film thickness is required, and is widely used in the industrial field, because the operation is very simple.

In the sputtering method, a target is used as a raw material of the thin film. The target is a solid containing a metal element which is to constitute the thin film to be formed. As the target, a sintered body of a metal, a metal oxide, a metal nitride, a metal carbide, or the like is used, or in some cases, a single crystal thereof is used. In the sputtering method, an apparatus having a vacuum chamber in which a substrate and a target can be placed is used, in general. After a substrate and a target are placed therein, the vacuum chamber is evacuated to high vacuum, and then the gas pressure inside the vacuum chamber is set to approximately 10 Pa or below by introducing a noble gas such as argon. Then, an argon plasma is generated by causing glow discharge between the substrate and the target where the substrate serves as an anode and the target serves as a cathode. The target serving as the cathode is bombard with argon cations in the plasma, and constituent particles of the target ejected by the bombardment are deposited onto the substrate to form a film.

Meanwhile, production of these transparent conductive films by the ion plating method is also studied. However, ITO films formed by the ion plating method have low resistance values. For example, when such an ITO film is used as a transparent electrode for a resistance-type touch panel, the thickness of the film has to be controlled to approximately 10 nm. Hence, it is very difficult to form such a film. In addition, as the panel size increases, it becomes difficult to control the variation in film thickness.

Here, indium oxide-based materials such as ITO are widely used for producing transparent conductive films as described above. However, indium metal is rare in the earth and is toxic, which raise concerns over adverse effects on the environment and the human body. For these reasons and the like, there is a demand for indium-free materials. As the indium-free materials, zinc oxide-based materials such as GZO and AZO and tin oxide-based materials such as FTO and ATO are known as mentioned above. Transparent conductive films are industrially produced from zinc oxide-based materials such as GZO and AZO by the sputtering method. However, these transparent conductive films are disadvantageous because of their poor chemical resistance (alkaline resistance and acid resistance) and the like. On the other hand, transparent conductive films of tin oxide-based materials such as FTO and ATO are excellent in chemical resistance, but it is difficult to produce a tin oxide-based sintered body target having a high density and a high durability. Hence, the transparent conductive films of tin oxide-based materials are disadvantageous in that these transparent conductive films are difficult to produce by the sputtering method.

In this respect, a Zn—Sn—O-based transparent conductive film is proposed as a material overcoming the above-described disadvantages. The Zn—Sn—O-based transparent conductive film is a material excellent in chemical resistance and hence overcomes the disadvantage of the zinc oxide-based transparent conductive film. As a Zn—Sn—O-based thin film, for example, a film is proposed which has a structure in which a transparent film made of a metal oxide of zinc and tin and a reflection film of chromium nitride are sequentially stacked on a glass substrate (see Patent Document 1). However, in Patent Document 1, the transparent film made of the metal oxide of zinc and tin is formed by a reactive sputtering method using a Zn—Sn-based alloy target, and hence the film characteristics of the formed transparent film are poorly reproducible. In addition, Patent Document 1 describes only the composition (Zn/Sn ratio) of the alloy target used, and does not describe the structure of the alloy target. In general, in a method for producing a metal oxide thin film by reactive sputtering using a metal target, the film composition and film characteristics vary remarkably, so that the yield tends to decrease. With a high direct current input power of an input power density of 2.0 $W/cm^2$ or more, the variation in film characteristics is especially remarkable, and the productivity deteriorates.

Moreover, a method for forming a film by a high-frequency sputtering method using a Zn—Sn—O-based oxide sintered body target is proposed (see Patent Document 2). Patent Document 2 recites that when the crystal particle diameter of the $Zn_2SnO_4$ phase is in the range from 1 to 10 µm, the target is less likely to be broken during film formation. However, in mass production of sputtering targets, a sintered body having a crystal particle diameter as coarse as about 10 µm is not preferable, because the sintered body is highly likely to have cracks and fracture when handled in a process such as grinding. In addition, in the proposal of Patent Document 2, only a calcined powder is used as the raw material powder. Hard particles of the calcined powder do not collapse in a favorable manner during the pressing. Hence, the strength of the obtained compact is so low that the compact is highly likely to fracture during the transportation or the like of the compact. Therefore, the proposal of Patent Document 2 is unsuitable for mass production. In addition, in the proposal of Patent Document 2, a $SnO_2$ crystal phase is present in the obtained oxide sintered body. As described in Patent Document 3 listed below, it is known that when a $SnO_2$ crystal phase is present in an oxide sintered body, arcing occurs frequently during film formation under a condition of a high direct current power input (with an input power density of 1.764 $W/cm^2$ or more). Moreover, occurrence of arcing with a high input power not only hinders stable formation of transparent conductive films having good characteristics, but also greatly deteriorates the productivity because there is no choice but to lower the input power value for suppressing the arcing. Hence, the proposal of Patent Document 2 is not preferable.

Under such a technical background, the applicant proposed a Zn—Sn—O-based oxide sintered body usable as a sputtering target or a tablet for vapor deposition such as ion plating for forming Zn—Sn—O-based thin films at high speed (see Patent Document 3).

Specifically, the Zn—Sn—O-based oxide sintered body is characterized by comprising a zinc oxide phase and a zinc stannate compound phase or comprising a zinc stannate compound phase, but containing neither a tin oxide crystal phase nor a tin oxide crystal phase in which zinc is dissolved to form a solid solution.

Note, however, that Patent Document 3 does not describe the resistance of the Zn—Sn—O-based oxide sintered body to thermal shock and the like. When the Zn—Sn—O-based oxide sintered body is used as a sputtering target or a tablet for vapor deposition without considering the resistance, cracks are formed in the Zn—Sn—O-based oxide sintered body during film formation by sputtering or ion plating, in some cases.

In addition, when cracks are formed in the Zn—Sn—O-based oxide sintered body serving as a sputtering target or a tablet for vapor deposition, not only the film characteristics of the produced transparent conductive films deteriorate and lose the stability, but also inevitable interruption of the film formation may result in great deterioration of the productivity.

In this respect, there is a demand for a Zn—Sn—O-based oxide sintered body which is resistant to breakage during the processing of the sintered body, which is also resistant to breakage and crack formation during the production of transparent conductive films (during film formation) when the sintered body is used as a sputtering target or a tablet for vapor deposition, and which enables high-speed and stable mass production of transparent conductive films without variation in film characteristics.

CONVENTIONAL ART DOCUMENTS

Patent Documents

Patent Document 1: Japanese Patent No. 2604474 (see Examples)
Patent Document 2: Japanese Patent Application Publication No. 2010-037161 (see Claims 1 and 14)
Patent Document 3: Japanese Patent No. 4552950 (see Claims 1 and 12)

DISCLOSURE OF THE INVENTION

Problems to be Solved by the Invention

The present invention has been made in view of the above-described demand, and an object of the present invention is to provide a Zn—Sn—O-based oxide sintered body which is resistant to breakage during processing of the sintered body, which is also resistant to breakage and crack formation during the production of transparent conductive films (during film formation) when the sintered body is used as a sputtering target or a tablet for vapor deposition, and which is stable in terms of both film formability and film characteristics of transparent conductive films, as well as a method for producing the Zn—Sn—O-based oxide sintered body.

Means for Solving the Problems

In this respect, the present inventors have earnestly studied to achieve the above object, and acquired the following technical knowledge.

Specifically, the present inventors have found that when an inert gas atmosphere of Ar gas or the like is employed in a cooling process of performing cooling in a sintering furnace in which the Zn—Sn—O-based oxide sintered body is sintered after completion of keeping of a highest sintering temperature, growth of crystal particles is suppressed, so that the mechanical strength of the sintered body can be improved. In addition, it has been found that, in such a case, the preferred orientation of the $Zn_2SnO_4$ phase is shifted from the conventional one, so that not only the breakage of the sintered body during production, but also formation of cracks during film formation of transparent conductive films can be suppressed. To be more specific, an inert gas atmosphere of Ar gas or the like is employed in the cooling process conducted after completion of keeping of a highest sintering temperature in order that the structure of the obtained sintered body can be such that the average crystal particle diameter is controlled to 4.5 µm or less in the sintering step of obtaining the Zn—Sn—O-based oxide sintered body. Since this suppresses excessive particle growth, the mechanical strength of the sintered body improves. Moreover, the above-described cooling process causes shift in the preferred orientation of the $Zn_2SnO_4$ phase in the sintered body, so that the degree of orientation represented by $I_{(222)}/[I_{(222)}+I_{(400)}]$ can be 0.52 or more, which is greater than the standard value (0.44). Here, $I_{(222)}$ and $I_{(400)}$ represent integrated intensities of the (222) plane and the (400) plane in the $Zn_2SnO_4$ phase measured by X-ray diffraction using the CuKα radiation. This characteristic, i.e., the controlled growth of the plane associated with the a-axis orientation, also contributes to the suppression of crack formation during film formation. The present invention has been completed based on these technical findings.

Specifically, a Zn—Sn—O-based oxide sintered body according to the present invention is a Zn—Sn—O-based oxide sintered body used as a sputtering target or a tablet for vapor deposition in producing a transparent conductive film by a sputtering method or a vapor deposition method, characterized in that tin is contained with an atomic ratio of Sn/(Zn+Sn) being 0.01 to 0.6, an average crystal particle diameter of the sintered body is 4.5 μm or less, and a degree of orientation represented by $I_{(222)}/[I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation.

Note that the Zn—Sn—O-based oxide sintered body according to the present invention may further comprise at least one element (M) selected from gallium, aluminum, titanium, niobium, tantalum, tungsten, molybdenum, and antimony with an atomic ratio of M/(Zn+Sn+M) being 0.01 or less.

Next, a method for producing a Zn—Sn—O-based oxide sintered body according to the present invention is characterized by comprising:

a granulated powder production step of drying a slurry obtained by mixing a zinc oxide powder and a tin oxide powder with pure water, an organic binder, and a dispersing agent, followed by granulation;

a compact production step of pressing the obtained granulated powder to obtain a compact; and a sintered body production step of sintering the obtained compact to obtain a sintered body, wherein the sintered body production step includes the steps of:

sintering the compact in a sintering furnace in an oxygen-containing atmosphere under a condition of 800° C. to 1400° C.; and after completion of keeping of a highest sintering temperature, setting the atmosphere inside the sintering furnace to an inert atmosphere and cooling the compact, to thereby obtain the sintered body.

Effects of the Invention

The Zn—Sn—O-based oxide sintered body according to the present invention is characterized in that tin is contained with an atomic ratio of Sn/(Zn+Sn) being 0.01 to 0.6, an average crystal particle diameter of the sintered body is 4.5 μm or less, and a degree of orientation represented by $I_{(222)} [I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation.

Thus, the Zn—Sn—O-based oxide sintered body according to the present invention has an improved mechanical strength. Hence, the Zn—Sn—O-based oxide sintered body achieves remarkable effects of being resistant to breakage during processing of the sintered body, also being resistant to breakage and crack formation during the production of transparent conductive films (during film formation) when used as a sputtering target or a tablet for vapor deposition, and moreover being stable in terms of both film formability and film characteristics of transparent conductive films to be produced.

BEST MODES FOR PRACTICING THE INVENTION

Hereinafter, embodiments of the present invention will be described in detail.

First, the present inventors have acquired the following technical knowledge on the basis of their experiments. Specifically, the mechanical strength of a Zn—Sn—O-based oxide sintered body used as a sputtering target or a tablet for vapor deposition can be improved by suppressing excessive growth of crystal particles in the sintered body, and moreover the susceptibility to the crack formation of a Zn—Sn—O-based oxide sintered body used as a sputtering target or a tablet for vapor deposition during film formation can be reduced by adjusting the orientation of the Zn—Sn—O-based oxide sintered body. More specifically, by employing an inert gas atmosphere of Ar gas or the like in a cooling process conducted after completion of keeping of a highest sintering temperature in a sintering furnace for obtaining a sintered body, the growth of crystal particles in the sintered body can be suppressed, so that the mechanical strength of the sintered body can be increased. Moreover, by the above-described cooling process, the preferred orientation of the $Zn_2SnO_4$ phase in the sintered body is shifted from the conventional one, so that the formation of cracks can be suppressed not only during production but also during film formation.

Specifically, the Zn—Sn—C-based oxide sintered body according to the present invention is an oxide sintered body which contains zinc and tin, and which is characterized in that the tin is contained with an atomic ratio of Sn/(Zn+Sn) being 0.01 to 0.6, an average crystal particle diameter of the sintered body is 4.5 μm or less, and a degree of orientation represented by $I_{(222)}/[I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation. Note that the Zn—Sn—O-based oxide sintered body only needs to be substantially made of zinc, tin, and oxygen, and may contain unavoidable impurities and the like.

The Zn—Sn—O-based oxide sintered body according to the present invention is used as a sputtering target or a tablet for vapor deposition. As described above, the Zn—Sn—O-based oxide sintered body according to the present invention is characterized in that the tin is contained with an atomic ratio of Sn/(Zn+Sn) being 0.01 to 0.6, and the average crystal particle diameter of crystal particles constituting the structure of the Zn—Sn—O-based oxide sintered body is 4.5 μm or less, and a degree of orientation represented by $I_{(222)} [I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation. This configuration makes it possible to suppress the crack formation even when a high power is applied during film formation. In addition, the content of tin in the Zn—Sn—O-based oxide sintered body is specified within the range where the atomic ratio of Sn/(Zn+Sn) is 0.01 to 0.6, because if the content is out of this range, the resistance value of the obtained sintered body increases, so that not only the productivity may deteriorate during film formation, but also characteristics of the obtained transparent conductive film may deteriorate.

Next, in the present invention, at least one element (M) selected from gallium, aluminum, titanium, niobium, tantalum, tungsten, molybdenum, and antimony may be added as a third component with an atomic ratio of M/(Zn+Sn+M) being 0.01 or less for the purpose of a sintering aid or resistance reduction. Moreover, the added element may be present at zinc sites or compound sites to form a solid solution. Note that zinc oxide has a wurtzite-type structure, in general.

Next, a method for producing the Zn—Sn—O-based oxide sintered body is described.

First, the method for producing the Zn—Sn—O-based oxide sintered body comprises:

a "granulated powder production step" of drying a slurry obtained by mixing a zinc oxide powder and a tin oxide powder, which are constituent elements of the above-described sintered body, with pure water, an organic binder, and a dispersing agent, followed by granulation;

a "compact production step" of pressing the obtained granulated powder to obtain a compact; and a "sintered body production step" of sintering the obtained compact to obtain the sintered body.

(Granulated Powder Production Step)

The granulated powder can be produced by any of the two methods shown below.

In a first method, a zinc oxide powder and a tin oxide powder, which are to be constituent elements, are mixed with pure water, an organic binder, and a dispersing agent with a concentration of the raw material powders being 50 to 80 wt % and preferably 60 wt %. Then, the mixture is ground in a wet manner, until an average particle diameter of the raw material powder becomes 0.5 μm or less. Since the average particle diameter of the raw material powder is reduced to 0.5 μm or less, aggregates of the zinc oxide powder and the tin oxide powder can be removed reliably. Next, after the grinding, a slurry is obtained by stirring for mixing for 30 minutes or more. Then, the obtained slurry is dried and granulated to produce a granulated powder.

In a second method, a zinc oxide powder, a tin oxide powder, and a calcined powder obtained by mixing and calcining a zinc oxide powder and a tin oxide powder are used as raw material powders. Note that for producing the calcined powder, the mixed powder is calcined at 800° C. to 1400° C. and preferably 900° C. to 1200° C.

Then, the zinc oxide powder, the tin oxide powder, and the calcined powder are mixed with pure water, an organic binder, and a dispersing agent, with the total concentration of the zinc oxide powder, the tin oxide powder, and the calcined powder, which are raw material powders, being 50 to 80 wt % and preferably 70 wt %. Then, the mixture is stirred for mixing for 30 minutes or more to obtain a slurry, and the obtained slurry is dried and granulated to produce a granulated powder.

(Compact Production Step)

The conditions for producing the compact are different between a case where the sintered body is used as a sputtering target and a case where the sintered body is used as a tablet for vapor deposition.

First, when the compact is formed as a sputtering target, the granulated powder is pressed under a pressure of 98 MPa (1.0 ton/cm$^2$) or higher to obtain the compact. If the granulated powder is pressed at less than 98 MPa, voids present among particles of the granulated powder are difficult to remove, so that the density of the sintered body decreases. Moreover, since the strength of the obtained compact decreases, the compact is difficult to produce stably. Note that the pressing is desirably conducted by employing cold isostatic pressing with which a high pressure can be achieved.

Meanwhile, when the compact is formed as a tablet for vapor deposition, the granulated powder is pressed by, for example, mechanical pressing in which the granulated powder is pressed in a die to obtain the compact. In this case, it is desirable to press the granulated powder at a pressure of 49 MPa (0.5 ton/cm$^2$) to 147 MPa (1.5 ton/cm$^2$), because a sintered body having a desired relative density can be obtained easily. In addition, the compact is preferably chamfered by using a die having chamfered edge portions for the pressing. This is because when the compact is chamfered, chipping and the like can be prevented during handling of the compact and during handling of the sintered body obtained by sintering the compact.

(Sintered Body Production Step)

The Zn—Sn—O-based oxide sintered body can be obtained by sintering the compact in an atmosphere where oxygen is contained in a sintering furnace, for example, under a normal pressure condition.

The sintering temperature is 800 to 1400° C., and preferably 1000° C. to 1300° C. If the sintering temperature is lower than 800° C., necessary contraction due to sintering is not obtained, which results in a low mechanical strength of the sintered body. Moreover, since contraction due to sintering proceeds insufficiently, the density and size of the obtained sintered body vary a lot. Meanwhile, if the sintering temperature exceeds 1400° C., zinc oxide, which serve as constituent elements, is vaporized, so that the composition deviates from the predetermined zinc oxide composition.

In addition, in a cooling process conducted after completion of keeping of a highest sintering temperature during the sintering process, the atmosphere inside the sintering furnace is set to an inert gas atmosphere of Ar gas, nitrogen gas, or the like. In this case, for example, if the atmosphere is set to a reactive one by introducing oxygen gas into the sintering furnace, particles of a $Zn_2SnO_4$ spinel compound are coarsened, so the strength of the sintered body becomes insufficient. This causes the formation of cracks during film formation.

In addition, by the above-described cooling process in the inert gas atmosphere, excessive growth of crystal particles in the sintered body is suppressed, and the preferred orientation of the $Zn_2SnO_4$ phase in the sintered body is shifted. Hence, when the obtained Zn—Sn—O-based oxide sintered body is used as a sputtering target or a tablet for vapor deposition, the sintered body is less susceptible to breakage and crack formation during production of transparent conductive films (during film formation), and achieves high stability in terms of both film formability and film characteristics of the produced transparent conductive films.

Note that, if necessary, the obtained sintered body is processed to a predetermined shape and predetermined dimensions, and, when used for sputtering, the sintered body is bonded to a predetermined backing plate and used as a target.

EXAMPLES

Hereinafter, the present invention is described specifically based on Examples and Comparative Examples. However, technical matters of the present invention are not limited to contents of Examples.

Example 1

As raw material powders, a ZnO powder and a $SnO_2$ powder each having an average particle diameter of 1 μm or less were blended with each other with the atomic ratio of Sn/(Zn+Sn) being 0.2, and then the raw material powder blend was mixed with pure water, an organic binder, and a dispersing agent in a mixing tank, with the concentration of the raw material powders being 60 wt %.

Next, the mixture was ground in a wet manner for 1 hour by using a bead mill apparatus (manufactured by Ashizawa Finetech Ltd., Model: LMZ) into which hard $ZrO_2$ balls were introduced, until the average particle diameter of the raw material powder became 0.5 μm or less. Then, the mixture was stirred for mixing in a mixing tank for 30 minutes or more to obtain a slurry.

Note that a laser diffraction particle size distribution analyzer (manufactured by Shimadzu Corporation, SALD-2200) was used for measuring the average particle diameter of the raw material powder.

Next, the obtained slurry was spray dried by using a spray dryer apparatus (manufactured by OHKAWARA KAKOHKI CO., LTD., Model: ODL-20) to obtain a granulated powder.

Next, the obtained granulated powder was pressed by applying a pressure of 294 MPa (3 ton/cm$^2$) thereto with a cold isostatic press to obtain a compact having a diameter of approximately 200 mm. Then, the compact was sintered in an atmospheric-pressure sintering furnace. Note that oxygen gas was introduced into the sintering furnace, the sintering temperature was set to 1300° C., and the compact was sintered for 20 hours. Then, in the cooling process conducted after completion of keeping of the highest sintering temperature (1300° C.), the atmosphere inside the furnace was set to an "Ar gas atmosphere" by introducing Ar gas into the sintering furnace, and the compact was cooled. Thus, a Zn—Sn—O-based oxide sintered body of Example 1 was obtained.

Then, a part of the obtained sintered body was cut, and the cut surface was subjected to mirror polishing and then a thermal corrosion treatment to make the grain boundaries observable. Then, the average crystal particle diameter was measured by SEM observation. The average crystal particle diameter was 3.7 μm.

In addition, the orientation of the $Zn_2SnO_4$ phase in the obtained Zn—Sn—O-based oxide sintered body of Example 1 was determined by X-ray diffraction using the CuKα radiation. The degree of orientation represented by $I_{(222)}/[I_{(222)}+I_{(400)}]$ was 0.54, where $I_{(222)}$ and $I_{(400)}$ represent integrated intensities of the (222) plane and the (400) plane.

Next, sputtering targets were obtained by processing the obtained Zn—Sn—O-based oxide sintered body of Example 1 to a diameter of 152.4 mm (6 inches) and a thickness of 5 mm.

Then, each obtained sputtering target was mounted on a sputtering apparatus (manufactured by Tokki Corporation, Ltd., SPF-530K), and then used for film formation by the sputtering method until the cumulative power reached 5 kWh. Then, the state of the targets was observed.

Note that the sputtering conditions were as follows: the distance between the substrate and the target was 46 mm; the degree of vacuum reached was $2.0 \times 10^{-4}$ Pa or below, and the gas pressure was 0.3 Pa.

As a result, no cracks were formed in the targets, and abnormal discharge or the like did not occur from the initial stage of the film formation to a cumulative power of 5 kWh.

Comparative Examples 1 and 2

A Zn—Sn—O-based oxide sintered body of Comparative Example 1 was obtained under the same conditions as in Example 1, except that an "$O_2$ gas atmosphere" into which $O_2$ gas was introduced was employed instead of the "Ar gas atmosphere" of Example 1 in the cooling process. In addition, a Zn—Sn—O-based oxide sintered body of Comparative Example 2 was obtained under the same conditions as in Example 1, except that a "normal pressure air" was employed instead of the "Ar gas atmosphere" of Example 1 in the cooling process.

Then, the average crystal particle diameter of each of the Zn—Sn—O-based oxide sintered bodies obtained in the same manner as in Example 1 was measured by SEM observation. The average crystal particle diameter was 5.1 μm (Comparative Example 1) and 4.0 μm (Comparative Example 2).

In addition, the degree of orientation represented by $I_{(222)}/[I_{(222)}+I_{(400)}]$ was measured in the same manner as in Example 1. The degree of orientation was 0.44 (Comparative Example 1) and 0.51 (Comparative Example 2).

Next, each of the Zn—Sn—O-based oxide sintered bodies of Comparative Examples 1 and 2 was processed to a diameter of 152.4 mm (6 inches) and a thickness of 5 mm to obtain sputtering targets of Comparative Examples 1 and 2.

Then, each of the obtained sputtering targets of Comparative Examples 1 and 2 was mounted on a sputtering apparatus (manufactured by Tokki Corporation, Ltd., SPF-530K), and then used for film formation by the sputtering method under the same conditions as in Example 1. After that, the state of the targets was observed.

As a result, cracks were formed in each of the targets of Comparative Examples 1 and 2. Possibly because of the influence of the cracks, abnormal discharge started to increase at a cumulative power of about 2 kWh, and the abnormal discharge occurred at 20 times/minute to 30 times/minute at the time point of a cumulative power of 5 kWh.

Examples 2 and 3 and Comparative Examples 3 and 4

Zn—Sn—O-based oxide sintered bodies were obtained under the same conditions as in Example 1, except that the sintering temperature was changed from "1300° C." as in Example 1 to 1400° C. (Example 2), 800° C. (Example 3), 1500° C. (Comparative Example 3), and 700° C. (Comparative Example 4).

Then, the average crystal particle diameter of each of the Zn—Sn—O-based oxide sintered bodies obtained in the same manner as in Example 1 was measured by SEM observation. The average crystal particle diameter was 4.4 μm (Example 2), 2.4 μm (Example 3), 5.1 μm (Comparative Example 3), and 1.9 μm (Comparative Example 4).

In addition, the degree of orientation represented by $I_{(222)}/[I_{(222)}+I_{(400)}]$ was measured in the same manner as in Example 1. The degree of orientation was 0.53 (Example 2), 0.55 (Example 3), 0.43 (Comparative Example 3), and 0.41 (Comparative Example 4).

Next, each of the Zn—Sn—O-based oxide sintered bodies was processed to a diameter of 152.4 mm (6 inches) and a thickness of 5 mm to obtain sputtering targets of Examples 2 and 3 and Comparative Examples 3 and 4.

Then, each of the sputtering targets of Examples 2 and 3 and Comparative Example 3, except for Comparative Example 4, was mounted on a sputtering apparatus (manufactured by Tokki Corporation, Ltd., SPF-530K), and then used for film formation by the sputtering method under the same conditions as in Example 1. After that, the state of the targets was observed.

As a result, no cracks were formed in each of the targets of Examples 2 and 3, and abnormal discharge or the like did not occur from the initial stage of the film formation to a cumulative power of 5 kWh.

On the other hand, in Comparative Example 3, cracks were formed in the targets, and, possibly because of the influence, of the cracks, abnormal discharge started to increase at a cumulative power of about 2 kWh, and the abnormal discharge occurred at 20 times/minute to 30 times/minute at the time point of a cumulative power of 5 kWh. In addition, since the crystal particles of the oxide sintered body of Comparative Example 3 were coarsened, the strength of the sintered body was so low that 4 targets among 20 targets were fractured during processing thereof.

Meanwhile, since the sintering temperature was low (700° C.) in Comparative Example 4, the sintering did not proceed, and 12 targets among 20 targets were fractured during processing thereof. Hence, the film formation test using the sputtering apparatus (manufactured by Tokki Corporation, Ltd., SPF-530K) was not conducted on Comparative Example 4.

It has been found that the oxide sintered bodies of Comparative Examples 3 and 4 cannot be used for mass production, which requires high productivity.

Examples 4, 5, 6, and Comparative Examples 5 and 6

Zn—Sn—O-based oxide sintered bodies were obtained by using a ZnO powder and a $SnO_2$ powder each having an average particle diameter of 1 μm or less as raw material powders under the same conditions as in Example 1, except that the atomic ratio of Sn/(Zn+Sn) was changed from "0.2" in Example 1 to 0.01 (Example 4), 0.4 (Example 5), 0.6 (Example 6), 0.0 (Comparative Example 5), and 0.7 (Comparative Example 6).

Then, the average crystal particle diameter of each of the Zn—Sn—O-based oxide sintered bodies obtained in the same manner as in Example 1 was measured by SEM observation. The average crystal particle diameter was 4.0 μm (Example 4), 3.9 μm (Example 5), 3.6 μm (Example 6), 4.0 μm (Comparative Example 5), and 3.5 μm (Comparative Example 6).

In addition, the degree of orientation represented by $I_{(222)}/[I_{(222)}+I_{(400)}]$ was measured in the same manner as in Example 1. The degree of orientation was 0.52 (Example 4), 0.55 (Example 5), 0.58 (Example 6), 0.45 (Comparative Example 5), and 0.58 (Comparative Example 6).

Next, each of the Zn—Sn—O-based oxide sintered bodies was processed to a diameter of 152.4 mm (6 inches) and a thickness of 5 mm to obtain sputtering targets of Examples 4, 5, and 6 and Comparative Examples 5 and 6.

Then, each of the sputtering targets was mounted on a sputtering apparatus (manufactured by Tokki Corporation, Ltd., SPF-530K), and used for film formation by the sputtering method under the same conditions as in Example 1. After that, the state of the targets was observed.

As a result, no cracks were formed in each of the targets of Examples 4, 5, and 6, and abnormal discharge or the like did not occur from the initial stage of the film formation to a cumulative power of 5 kWh.

On the other hand, a large number of nodules were formed on the surface of each of the targets of Comparative Examples 5 and 6 possibly because of the effect of the high resistance value of the target. Because of this, abnormal discharge started to increase at a cumulative power of about 2 kWh, and the abnormal discharge occurred 20 times/minute to 30 times/minute at the time point of a cumulative power of 5 kWh.

In addition to this, a large number of minute cracks were formed in each of the targets of Comparative Examples 5 and 6. These indicate that the oxide sintered bodies of Comparative Examples 5 and 6 cannot be used for mass production, which requires high productivity.

Examples 7 to 14

Zn—Sn—O-based oxide sintered bodies were obtained under the same conditions as in Example 1, except that a ZnO powder, a $SnO_2$ powder, and an oxide powder of a third metal element each having an average particle diameter of 1 μm or less were used as raw material powders, the atomic ratio of M/(Zn+Sn+M) was 0.01, where M represented the third metal element, and the third metal element was gallium (Example 7), aluminum (Example 8), titanium (Example 9), niobium (Example 10), tantalum (Example 11), tungsten (Example 12), molybdenum (Example 13), and antimony (Example 14).

Then, the average crystal particle diameter of each of the Zn—Sn—O-based oxide sintered bodies obtained in the same manner as in Example 1 was measured by SEM observation. The average crystal particle diameter was 3.9 μm (Example 7), 3.8 μm (Example 8), 4.1 μm (Example 9), 3.8 μm (Example 10), 3.9 μm (Example 11), 4.0 μm (Example 12), 4.0 μm (Example 13), and 3.8 μm (Example 14).

In addition, the degree of orientation represented by $I_{(222)}/[I_{(222)}+I_{(400)}]$ was measured in the same manner as in Example 1. The degree of orientation was 0.55 (Example 7), 0.54 (Example 8), 0.55 (Example 9), 0.53 (Example 10), 0.53 (Example 11), 0.54 (Example 12), 0.56 (Example 13), and 0.55 (Example 14).

Next, each of the Zn—Sn—O-based oxide sintered bodies was processed to a diameter of 152.4 mm (6 inches) and a thickness of 5 mm to obtain sputtering targets of Examples 7 to Example 14.

Then, each of the sputtering targets was mounted on a sputtering apparatus (manufactured by Tokki Corporation, Ltd., SPF-530K), and used for film formation by the sputtering method under the same conditions as in Example 1. After that, the state of the target was observed.

As a result, no cracks were formed in any one of the targets of Examples 7 to 14, and abnormal discharge or the like did not occur from the initial stage of the film formation to a cumulative power of 5 kWh.

Example 15

A ZnO powder and a $SnO_2$ powder each having an average particle diameter of 1 μm or less, which were used as raw material powders, were weighed with the atomic ratio of Sn/(Zn+Sn) being 0.2.

Next, a slurry having a concentration of the raw material powders of 60 wt % was prepared in a mixing tank by blending 60 wt % of the ZnO powder and 60 wt % of the $SnO_2$ powder with pure water and an organic dispersing agent.

Next, the obtained slurry was spray dried by using a spray dryer apparatus (manufactured by OHKAWARA KAKOHKI CO., LTD., Model: ODL-20) to obtain a mixture powder having a particle diameter of 300 μm or less.

The mixture powder was sintered in an atmospheric-pressure sintering furnace at 1200° C. for 20 hours. After the sintering, the sintered mixture powder was ground to obtain a calcined powder having a particle diameter of 300 μm or less.

Then, a slurry having a concentration of the raw material powders of 70 wt % was prepared by blending the obtained calcined powder with the remaining parts of the weighed ZnO and SnO$_2$ powders, pure water, an organic binder, and a dispersing agent, and then stirring for mixing for 30 minutes or more in a mixing tank. Then, the slurry was spray dried by using the spray dryer apparatus to obtain a granulated powder having a particle diameter of 300 μm.

The obtained granulated powder was pressed in a die by using a press (manufactured by Sansho Industry Co., Ltd., wave press) to obtain 200 circular cylinder-shaped compacts each having a diameter of 30 mm and a height of 40 mm.

Next, the obtained circular cylinder-shaped compacts were sintered in an atmospheric-pressure sintering furnace. Note that after oxygen gas was introduced into the sintering furnace, the compacts were sintered for 20 hours at a sintering temperature of 1100° C. After that, in a cooling process conducted after completion of keeping of the highest sintering temperature (1100° C.), the atmosphere inside the furnace was set to an "Ar gas atmosphere" by introducing Ar gas into the sintering furnace, and the compacts were cooled. Thus, circular cylinder-shaped Zn—Sn—O-based oxide sintered bodies of Example 15 were obtained.

Then, the average crystal particle diameter of each of the obtained Zn—Sn—O-based oxide sintered bodies was measured by SEM observation in the same manner as in Example 1. The average crystal particle diameter was 3.1 μm.

In addition, the degree of orientation represented by $I_{(222)}/[I_{(222)}+I_{(400)}]$ was measured in the same manner as in Example 1. The degree of orientation was 0.52.

Next, vapor deposition was conducted by using each of the circular cylinder-shaped Zn—Sn—O-based oxide sintered bodies of Example 15 as a tablet for vapor deposition, placing the tablet in a vacuum vapor deposition apparatus, and irradiating the tablet with electron beams. None of the tablets of Example 15 underwent chipping or crack formation during automatic transfer, and it was found that these tablets enabled stable film formation.

Comparative Examples 7 and 8

Circular cylinder-shaped Zn—Sn—O-based oxide sintered bodies of Comparative Example 7 were obtained under the same conditions as in Example 15, except that an "O$_2$ gas atmosphere" into which O$_2$ gas was introduced was employed instead of the "Ar gas atmosphere" of Example 15 in the cooling process. In addition, circular cylinder-shaped Zn—Sn—O-based oxide sintered bodies of Comparative Example 8 were obtained under the same conditions as in Example 15, except that "normal pressure air" was employed instead of the "Ar gas atmosphere" of Example 15 in the cooling process.

Then, the average crystal particle diameter of each of the obtained Zn—Sn—O-based oxide sintered bodies was measured by SEM observation in the same manner as in Example 1. The average crystal particle diameter was 4.6 μm (Comparative Example 7) and 3.3 μm (Comparative Example 8).

In addition, the degree of orientation represented by $I_{(222)}/[I_{(222)}+I_{(400)}]$ was measured in the same manner as in Example 1. The degree of orientation was 0.44 (Comparative Example 7) and 0.47 (Comparative Example 8).

Next, vapor deposition was conducted by using each of the circular cylinder-shaped Zn—Sn—O-based oxide sintered bodies of Comparative Examples 7 and 8 as a tablet for vapor deposition, placing the tablet for vapor deposition in a vacuum vapor deposition apparatus, and irradiating the tablet with electron beams. In each of Comparative Examples 7 and 8, cracks were formed in 3 tablets among 50 tablets used.

Examples 16 and 17 and Comparative Examples 9 and 10

Circular cylinder-shaped Zn—Sn—O-based oxide sintered bodies were obtained under the same conditions as in Example 15, except that the sintering temperature was changed from "1100° C." as in Example 15 to 1400° C. (Example 16), 800° C. (Example 17), 1500° C. (Comparative Example 9), and 700° C. (Comparative Example 10).

Then, the average crystal particle diameter of each of the obtained Zn—Sn—O-based oxide sintered bodies was measured by SEM observation in the same manner as in Example 1. The average crystal particle diameter was 3.6 μm (Example 16), 2.0 μm (Example 17), 5.0 μm (Comparative Example 9), and 1.7 μm (Comparative Example 10).

In addition, the degree of orientation represented by $I_{(222)}/[I_{(222)}+I_{(400)}]$ was measured in the same manner as in Example 1. The degree of orientation was 0.54 (Example 16), 0.52 (Example 17), 0.44 (Comparative Example 9), and 0.44 (Comparative Example 10).

Next, vapor deposition was conducted by using each of the circular cylinder-shaped Zn—Sn—O-based oxide sintered bodies of Examples 16 and 17 and Comparative Examples 9 and 10 as a tablet for vapor deposition, placing the tablet for vapor deposition in a vacuum vapor deposition apparatus, and irradiating the tablet with electron beams. Neither chipping nor crack formation occurred in any one of the tablets of Examples 16 and Example 17 during automatic transfer, and it was found that these tablets enabled stable film formation.

On the other hand, cracks were formed in 3 tablets among 50 tablets of Comparative Example 9 used. In addition, since the sintering of the tablets of Comparative Example 10 did not proceed, cracks were formed in 9 tablets among 50 tablets during automatic transfer. Moreover, cracks were formed during film formation in 2 tablets among 41 tablets in which no cracks were formed during the automatic transfer.

Here, "Table 1-1" and "Table 1-2" below collectively show "application of sintered bodies", "Sn/(Zn+Sn)", "the presence or absence of third component", "sintering temperature (° C.)", "atmosphere during cooling", "fracture formation during production step", "average crystal particle diameter (μm)", "degree of orientation of Zn$_2$SnO$_4$" and "crack formation during film formation" of each of Examples 1 to 17 and Comparative Examples 1 to 10 described above.

TABLE 1-1

| | Application of sintered body | Sn/(Zn + Sn) | Third component | Sintering temperature (° C.) |
|---|---|---|---|---|
| Ex. 1 | Target | 0.2 | — | 1300 |
| Ex. 2 | | 0.2 | — | 1400 |
| Ex. 3 | | 0.2 | — | 800 |
| Ex. 4 | | 0.01 | — | 1300 |
| Ex. 5 | | 0.4 | — | 1300 |

TABLE 1-1-continued

| | Application of sintered body | Sn/(Zn + Sn) | Third component | Sintering temperature (° C.) |
|---|---|---|---|---|
| Ex. 6 | | 0.6 | — | 1300 |
| Ex. 7 | | 0.2 | Gallium | 1300 |
| Ex. 8 | | 0.2 | Aluminum | 1300 |
| Ex. 9 | | 0.2 | Titanium | 1300 |
| Ex. 10 | | 0.2 | Niobium | 1300 |
| Ex. 11 | | 0.2 | Tantalum | 1300 |
| Ex. 12 | | 0.2 | Tungsten | 1300 |
| Ex. 13 | | 0.2 | Molybdenum | 1300 |
| Ex. 14 | | 0.2 | Antimony | 1300 |
| Ex. 15 | Tablet | 0.2 | — | 1100 |
| Ex. 16 | | 0.2 | — | 1400 |
| Ex. 17 | | 0.2 | — | 800 |
| Comp. Ex. 1 | Target | 0.2 | — | 1300 |
| Comp. Ex. 2 | | 0.2 | — | 1300 |
| Comp. Ex. 3 | | 0.2 | — | 1500 |
| Comp. Ex. 4 | | 0.2 | — | 700 |
| Comp. Ex. 5 | | 0.0 | — | 1300 |
| Comp. Ex. 6 | | 0.7 | — | 1300 |
| Comp. Ex. 7 | Tablet | 0.2 | — | 1100 |
| Comp. Ex. 8 | | 0.2 | — | 1100 |
| Comp. Ex. 9 | | 0.2 | — | 1500 |
| Comp. Ex. 10 | | 0.2 | — | 700 |

TABLE 1-2

| | Atmosphere during cooling | Fracture formation during production step | Average crystal particle diameter (μm) | Degree of orientation of $Zn_2SnO_4$ | Crack formation during film formation |
|---|---|---|---|---|---|
| Ex. 1 | Ar | Not formed | 3.7 | 0.54 | Not formed |
| Ex. 2 | Ar | Not formed | 4.4 | 0.53 | Not formed |
| Ex. 3 | Ar | Not formed | 2.4 | 0.55 | Not formed |
| Ex. 4 | Ar | Not formed | 4.0 | 0.52 | Not formed |
| Ex. 5 | Ar | Not formed | 3.9 | 0.55 | Not formed |
| Ex. 6 | Ar | Not formed | 3.6 | 0.58 | Not formed |
| Ex. 7 | Ar | Not formed | 3.9 | 0.55 | Not formed |
| Ex. 8 | Ar | Not formed | 3.8 | 0.54 | Not formed |
| Ex. 9 | Ar | Not formed | 4.1 | 0.55 | Not formed |
| Ex. 10 | Ar | Not formed | 3.8 | 0.53 | Not formed |
| Ex. 11 | Ar | Not formed | 3.9 | 0.53 | Not formed |
| Ex. 12 | Ar | Not formed | 4.0 | 0.54 | Not formed |
| Ex. 13 | Ar | Not formed | 4.0 | 0.56 | Not formed |
| Ex. 14 | Ar | Not formed | 3.8 | 0.55 | Not formed |
| Ex. 15 | Ar | Not formed | 3.1 | 0.52 | Not formed |
| Ex. 16 | Ar | Not formed | 3.6 | 0.54 | Not formed |
| Ex. 17 | Ar | Not formed | 2.0 | 0.52 | Not formed |
| Comp. Ex. 1 | Oxygen | Not formed | 5.1 | 0.44 | Formed |
| Comp. Ex. 2 | Air | Not formed | 4.0 | 0.51 | Formed |
| Comp. Ex. 3 | Ar | Formed | 5.1 | 0.43 | Formed |
| Comp. Ex. 4 | Ar | Formed | 1.9 | 0.41 | — |
| Comp. Ex. 5 | Ar | Not formed | 4.0 | 0.45 | Formed |
| Comp. Ex. 6 | Ar | Not formed | 3.5 | 0.58 | Formed |
| Comp. Ex. 7 | Oxygen | Not formed | 4.6 | 0.44 | Formed |
| Comp. Ex. 8 | Air | Not formed | 3.3 | 0.47 | Formed |
| Comp. Ex. 9 | Ar | Not formed | 5.0 | 0.44 | Formed |
| Comp. Ex. 10 | Ar | Not formed | 1.7 | 0.44 | Formed |

POSSIBILITY OF INDUSTRIAL APPLICATION

The Zn—Sn—O-based oxide sintered body according to the present invention has an improved mechanical strength, so that the Zn—Sn—O-based oxide sintered body is resistant to breakage during processing of the sintered body, is also resistant to breakage and crack formation during production of transparent conductive films when the sintered body is used as a sputtering target or a tablet for vapor deposition, and moreover is stable in terms of both film formability and film characteristics of transparent conductive films to be produced. Accordingly, the Zn—Sn—O-based oxide sintered body according to the present invention has an industrial applicability of being used as a sputtering target or a tablet for vapor deposition for forming transparent electrodes of solar cells, touch panels, and the like.

The invention claimed is:

1. A Zn—Sn—O-based oxide sintered body comprising zinc, tin, and oxygen, used as a sputtering target or a tablet for vapor deposition, wherein the oxide sintered body is produced by steps comprising:
   sintering a compact in a sintering furnace in an oxygen-containing atmosphere under a condition of 800° C. to 1400° C.; and
   keeping at a highest sintering temperature to complete sintering, then setting the atmosphere inside the sintering furnace to an inert gas atmosphere and cooling the compact, to thereby obtain the sintered body,
   tin is contained with an atomic ratio of Sn/(Zn+Sn) being 0.01 to 0.6,
   an average crystal particle diameter of the sintered body is 4.5 μm or less, and
   a degree of orientation represented by $I_{(222)}/[I_{(222)}+I_{(400)}]$ is 0.52 or more, where $I_{(222)}$ and $I_{(400)}$ represent integrated intensities of the (222) plane and the (400) plane of a $Zn_2SnO_4$ phase measured by X-ray diffraction using the CuKα radiation.

2. The Zn—Sn—O-based oxide sintered body according to claim 1, further comprising:
   at least one element selected from gallium, aluminum, titanium, niobium, tantalum, tungsten, molybdenum, and antimony as an additional element, wherein
   the additional element (M) is contained with an atomic ratio relative to the total amount of all the metal elements of M/(Zn+Sn+M) being 0.01 or less.

3. A method for producing the Zn—Sn—O-based oxide sintered body according to claim 1, the method comprising:
   a granulated powder production step comprising drying a slurry obtained by mixing a zinc oxide powder and a tin oxide powder with pure water, an organic binder, and a dispersing agent, followed by granulating the dried slurry to obtain a granulated powder;

a compact production step comprising pressing the obtained granulated powder to obtain a compact; and producing the sintered body by steps comprising:

sintering the compact in a sintering furnace in an oxygen-containing atmosphere under a condition of 800° C. to 1400° C.; and keeping at a highest sintering temperature to complete sintering, then setting the atmosphere inside the sintering furnace to an inert gas atmosphere and cooling the compact, to thereby obtain the sintered body.

4. The method for producing the Zn—Sn—O-based oxide sintered body according to claim 3, wherein in the granulated powder production step, the slurry is obtained by mixing the zinc oxide powder and the tin oxide powder with the pure water, the organic binder, and the dispersing agent with a concentration of the zinc oxide powder and the tin oxide powder, which are raw material powders, being 50 to 80 wt % in the slurry, grinding the mixture in a wet manner until the average particle diameter of the raw material powders becomes 0.5 µm or less, and then stirring the mixture for 30 minutes or more.

5. The method for producing the Zn—Sn—O-based oxide sintered body according to claim 3, wherein in the granulated powder production step, the slurry is obtained by mixing the zinc oxide powder, the tin oxide powder, and a calcined powder, which is obtained by mixing and calcining a zinc oxide powder and a tin oxide powder, with the pure water, the organic binder, and the dispersing agent, with a total concentration of the zinc oxide powder, the tin oxide powder, and the calcined powder, which are raw material powders, being 50 to 80 wt % in the slurry, and by stirring the mixture for 30 minutes or more.

6. The method for producing a Zn—Sn—O-based oxide sintered body according to claim 5, wherein the calcined powder is obtained by mixing the zinc oxide powder and the tin oxide powder and calcining the mixture under a condition of 800° C. to 1400° C.

7. A method for producing the Zn—Sn—O-based oxide sintered body according to claim 2, the method comprising:

a granulated powder production step comprising drying a slurry obtained by mixing a zinc oxide powder and a tin oxide powder with pure water, an organic binder, and a dispersing agent, followed by granulating the dried slurry to obtain a granulated powder;

a compact production step comprising pressing the obtained granulated powder to obtain a compact; and producing the sintered body by steps comprising:

sintering the compact in a sintering furnace in an oxygen-containing atmosphere under a condition of 800° C. to 1400° C.; and keeping at a highest sintering temperature to complete sintering, then setting the atmosphere inside the sintering furnace to an inert gas atmosphere and cooling the compact, to thereby obtain the sintered body.

* * * * *